(12) United States Patent
Tomita et al.

(10) Patent No.: US 7,632,356 B2
(45) Date of Patent: Dec. 15, 2009

(54) GAS PROVIDING MEMBER AND PROCESSING DEVICE

(75) Inventors: Yasumitsu Tomita, Handa (JP); Yutaka Unno, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 113 days.

(21) Appl. No.: 11/374,529

(22) Filed: Mar. 13, 2006

(65) Prior Publication Data

US 2006/0207509 A1   Sep. 21, 2006

Related U.S. Application Data

(60) Provisional application No. 60/662,188, filed on Mar. 16, 2005.

(51) Int. Cl.
*C23C 16/455*   (2006.01)
*C23C 16/458*   (2006.01)
*H01L 21/306*   (2006.01)

(52) U.S. Cl. .................. 118/728; 118/715; 156/345.33; 156/345.34

(58) Field of Classification Search .................. 118/715, 118/719, 725, 728; 219/385; 156/345.33, 156/345.34
See application file for complete search history.

(56) References Cited

U.S. PATENT DOCUMENTS

| | | | | |
|---|---|---|---|---|
| 5,447,570 A | * | 9/1995 | Schmitz et al. | 118/728 |
| 6,179,924 B1 | * | 1/2001 | Zhao et al. | 118/725 |
| 6,223,447 B1 | | 5/2001 | Yudovsky et al. | |
| 6,494,955 B1 | * | 12/2002 | Lei et al. | 118/715 |

FOREIGN PATENT DOCUMENTS

| | | |
|---|---|---|
| EP | 0 698 674 A2 | 2/1996 |
| EP | 1 167 573 A1 | 1/2002 |
| JP | 2002-093894 A1 | 3/2002 |
| WO | 99/56307 A1 | 11/1999 |

* cited by examiner

*Primary Examiner*—Parviz Hassanzadeh
*Assistant Examiner*—Satish Chandra
(74) *Attorney, Agent, or Firm*—Burr & Brown

(57) ABSTRACT

A gas providing member includes a body portion which forms a gas providing passage between the body portion and a processing member which holds the processing target, and the gas providing passage provides gas onto a processing target. In the body portion, a gas reservoir portion located in the gas providing passage is formed.

12 Claims, 3 Drawing Sheets

GAS PROVIDING MEMBER AND PROCESSING DEVICE

CROSS REFERENCE TO RELATED APPLICATIONS

This application is based upon and claims the benefit of priority from prior U.S. Provisional Application No. 60/662,188, filed on Mar. 16, 2005; the entire contents of which are incorporated herein by reference.

BACKGROUND OF THE INVENTION

1. Field of the Invention

The present invention relates to a gas providing member and to a processing device using the same.

2. Description of the Related Art

In conventional manufacturing processes for semiconductor devices and liquid crystal devices, a heating member which performs heating processing for a substrate such as a semiconductor substrate and a liquid crystal substrate is used. In order to provide gas onto a substrate held by the heating member, a processing device in which a ring member is disposed on an outer circumference side of the heating member has been proposed (for example, refer to Japanese Patent Laid-Open Publication No. 2002-93894).

Here, in the conventional processing device shown in FIG. 1, a gas providing passage 325 is formed between a ring member 320 and a heating member 310. Since an upper bottom surface 324 of the ring member 320 is flat, the gas hits the upper bottom surface 324 and turbulence of a gas flow X occurs. Owing to the disturbed gas flow X, it has been difficult to stably provide the gas to a substrate 2.

SUMMARY OF THE INVENTION

It is an object of the present invention to provide a gas providing member and a processing device, which are capable of stably providing gas to a processing target.

A processing device according to an embodiment of the present invention includes: a processing member which holds a processing target; and a gas providing member located on an outer circumference side of the processing member. A gas providing member according to the embodiment of the present invention includes a body portion which forms a gas providing passage between the body portion and a processing member, in which gas is provided onto the processing target through the gas providing passage. In addition, in the body portion, a gas reservoir portion is formed in the gas providing passage and located in the gas providing passage.

According to the gas providing member and the processing device, which are described above, turbulence of a gas flow is generated inside of the gas reservoir portion located in the gas providing passage, thus making it possible to reduce the turbulence of the flow of the gas provided onto the processing target. Therefore, the gas can be stably provided to the processing target.

DETAILED DESCRIPTION OF THE EMBODIMENTS

Figure 1:
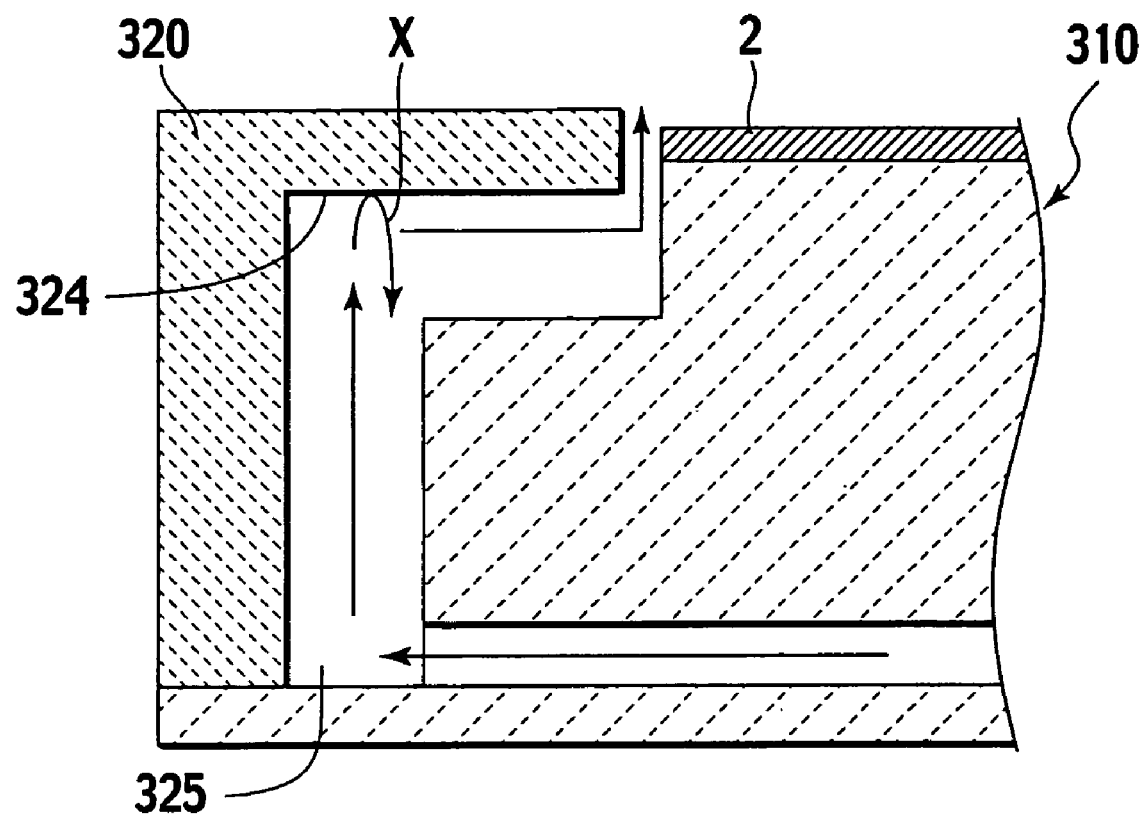
FIG. 1 is a partial cross-sectional view of a conventional ring member and a conventional heating member.
Figure 2:
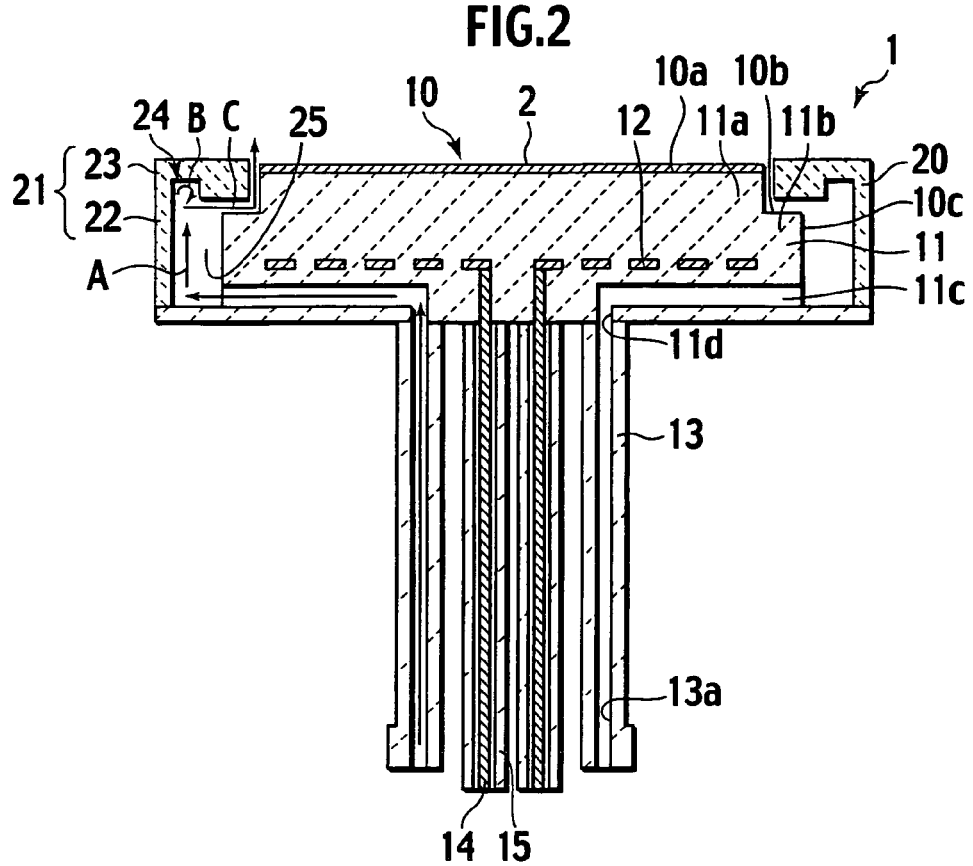
FIG. 2 is a cross-sectional view of a processing device according to an embodiment of the present invention.

As shown in FIG. 2, a processing device 1 includes a heating member 10, and a gas providing member 20. Moreover, FIG. 2 shows the cross-sectional view when cut through the center of the heating member 10. The processing device 1 performs a variety of processing for a processing target. The processing target includes, for example, a substrate such as a semiconductor substrate and a liquid crystal substrate. A description will be made below of an embodiment by taking as an example the processing device 1 which performs heating processing for a substrate 2 as the processing target.

The heating member 10 is one of processing members which hold a processing target and perform processing for the processing target. The heating member 10 performs heating processing for the substrate 2 as the processing target. The heating member 10 includes a substrate mounting surface 10a, on which the substrate 2 is mounted. Then, the heating member 10 heats the substrate 2 on the substrate mounting surface 10a.

The gas providing member 20 is disposed on an outer circumference side of the heating member 10. Hence, the gas providing member 20 is also disposed on an outer circumference side of the substrate mounting surface 10a. The gas providing member 20 forms a gas providing passage 25 between the gas providing member 20 itself and the heating member 10 and provides gas to the processing target. Specifically, the gas providing member 20 provides gas onto the substrate 2 mounted on the substrate mounting surface 10a. The gas to be provided includes atmospheric gas which stabilizes a process on the substrate 2, reaction gas, and the like. As the atmospheric gas, for example, nitrogen gas, argon gas, helium gas, and the like can be used.

Figure 3:
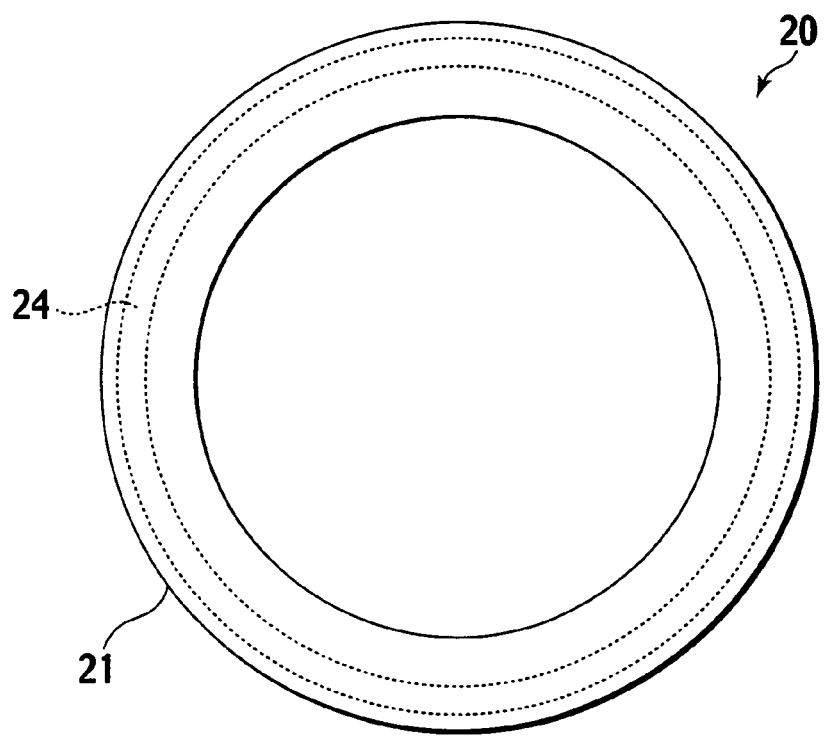
FIG. 3 is a plan view of a gas providing member according to the embodiment of the present invention.

Next, a description will be made below in detail of the gas providing member 20 and the heating member 10. As shown in FIG. 2 and FIG. 3, the gas providing member 20 includes a body portion 21. The body portion 21 forms the gas providing passage 25 between the body portion 21 itself and the heating member 10, and through which the gas is provided to the processing target.

Specifically, the body portion 21 includes a tubular portion 22, and an upper plate portion 23. The tubular portion 22 forms the gas providing passage 25 between the tubular portion 22 itself and a side surface 10c of the heating member 10. In such a way, the gas providing passage 25 which has a path from a lower portion of the heating member 10 toward an upper portion thereof can be formed. The upper plate portion 23 forms the gas providing passage 25 between the upper plate portion 23 itself and a step difference portion 10b of the heating member 10. In such a way, the gas providing passage 25 which has a path from the outer circumference side of the heating member 10 toward an inner circumference side thereof can be formed.

The body portion 21 can be formed to fit a shape of the heating member 10. For example, when an outer circumference shape of the heating member 10 is circular, the tubular portion 22 can be formed into a cylindrical shape. When the outer circumference shape of the heating member 10 is polygonal, the tubular portion 22 can be formed into a polygonal shape. Moreover, when the heating member 10 has the step difference portion 10b, which is annular when viewed from the above, at a lower position than the substrate mounting surface 10a, which is around the substrate mounting surface 10a, the upper plate portion 23 can be formed into an annular shape.

Furthermore, preferably, a size of the body portion 21, for example, thickness and diameter (width) of the tubular portion 22, thickness and diameter of the upper plate portion 23, and the like, are set so that a width in a crosswise direction of the gas providing passage 25 formed between the body portion 21 and the heating member 10 can be 2 to 20 mm. More preferably, the width of the gas providing passage 25 is set at 2 to 10 mm.

In the body portion 21, a gas reservoir portion 24 is formed. The gas reservoir portion 24 is located in the gas providing passage 25. The gas accumulates in the gas reservoir portion 24, and turbulence occurs in a gas flow. Specifically, the turbulence of the gas flow can be generated in the gas reservoir portion 24 located in the gas providing passage 25. As a result, turbulence of a flow of the gas provided onto the substrate 2 as the processing target can be reduced, and accordingly, the gas can be provided to the substrate 2 stably and smoothly.

The gas reservoir portion 24 just needs to be formed anywhere in the gas providing passage 25, and the position thereof is not limited. However, it is preferable that the gas reservoir portion 24 be formed at a position where a direction of the gas flow is changed. According to this, large turbulence of the gas flow can be generated in the gas reservoir portion 24, and the turbulence of the flow of the gas provided to the substrate 2 can be further suppressed. Hence, the gas can be provided to the substrate 2 more stably.

For example, as shown in FIG. 2, it is preferable to form the gas reservoir portion 24 at a position where a flowing direction of a gas flow A going from the lower portion of the gas providing passage 25 toward the upper portion thereof is changed to a flowing direction of a gas flow C going from the crosswise outside of the gas providing passage 25 toward the crosswise inside thereof. Specifically, with regard to the flowing direction, the gas flow A flowing toward the upper portion of the gas providing passage 25 is changed to the gas flow C in the direction to the right, flowing toward the crosswise inside of the gas providing passage 25 at the position of the gas reservoir portion 24.

In such a way, a disturbed gas flow B can be generated inside of the gas reservoir portion 24. As a result, the turbulence of the gas flow C which passes below the gas reservoir portion 24 and is sent out onto the substrate 2 can be reduced.

Moreover, it is preferable that the gas reservoir portion 24 be formed in the upper portion of the gas providing passage 25 (in a downstream portion of the gas flow in the gas providing passage 25). According to this, the turbulence of the gas flow C which happens near the substrate 2 held on the heating member 10 can be reduced. Hence, the gas can be provided to the substrate 2 more stably.

As the gas reservoir portion 24, for example, as shown in FIG. 3, an annular groove going around the body portion 21 along a circumference direction when viewed from the above can be formed. A cross-sectional shape of the gas reservoir portion 24 (groove) may be, but not limited to, rectangular, semicircular, and the like. It is preferable that a width of the gas reservoir portion 24 (groove) be 1 to 10 mm. It is preferable that a depth of the gas reservoir portion 24 (groove) be 1 to 10 mm. Moreover, it is not necessary that the gas reservoir portion 24 (groove) be formed all around the body portion 21 in the circumference direction, and a plurality of the gas reservoir portions 24 may be formed at an interval.

Figure 4:
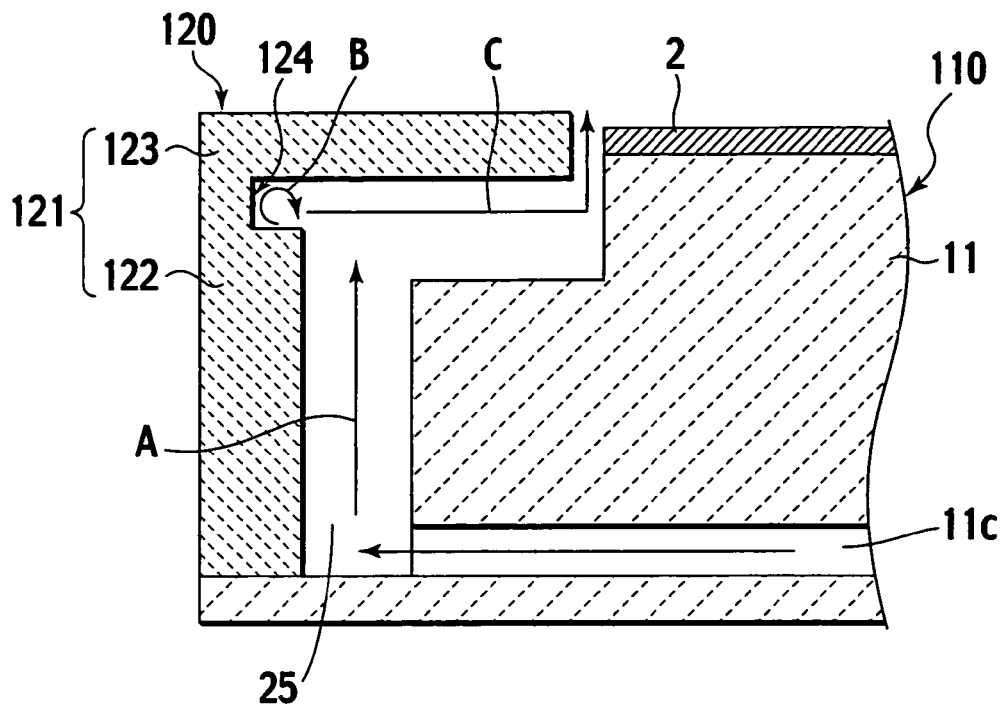
FIG. 4 and FIG. 5 are partial cross-sectional views of the gas providing members and heating members according to the embodiment of the present invention.

The gas reservoir portion may be formed in the upper plate portion 23 of the body portion 21 as shown in FIG. 2, or may be formed in a tubular portion 122 as in a gas providing member 120 shown in FIG. 4. In FIG. 4, the body portion 121 includes the tubular portion 122, and an upper plate portion 123. A gas reservoir portion 124 is formed at the position where the gas flow A going from the lower portion of the gas providing passage 25 toward the upper portion thereof is changed to the gas flow C going from the crosswise outside of the gas providing passage 25 toward the crosswise inside thereof. In the gas reservoir portion 124, the disturbed gas flow B can be generated. As a result, the turbulence of the gas flow C which passes on the side of the gas reservoir portion 124 and is sent out onto the substrate 2 can be reduced.

It is preferable that the body portion 21 and 121 be formed of ceramics. For example, the body portion 21 and 121 can contain aluminum nitride (AlN), silicon nitride ($Si_3N_4$), silicon carbide (SiC), alumina ($Al_2O_3$), sialon (SiAlON), and the like. According to this, the gas providing member 20 and 120 excellent in heat resistance can be provided.

The gas providing member 20 and 120 as described above can be fabricated, for example, in a manner as described below.

First, ceramic powder serving as a main component and sintering aids are mixed together to prepare ceramic raw material powder. To the ceramic raw material powder, a binder, water, and a dispersant are added and mixed, and slurry is made. The slurry is granulated by a spray granulation method and the like, and granulated powder is made. By using the granulated powder, a ceramic molded body which becomes the body portion 21 or 121 is fabricated by a molding method such as a die molding method, a cold isostatic pressing (CIP) method, and a slip cast method.

The ceramic molded body is fired by a firing method such as a hot press method and a normal pressure sintering method under firing conditions corresponding to a type of the ceramic raw material powder, and the body portion 21 or 121 formed of the ceramics is fabricated. Then, the body portion 21 or 121 is processed to form the gas reservoir portion 24 or 124. Thus, the gas providing member 20 or 120 is completed.

Alternatively, a ceramic molded body in which the gas reservoir portion 24 or 124 is formed is fabricated and fired, and also in such a way, the gas providing member 20 or 120 in which the gas reservoir portion 24 or 124 is formed can be obtained.

Moreover, the tubular portion 22 or 122 and the upper plate portion 23 or 123 are fabricated separately from each other, and the tubular portion 22 or 122 and the upper plate portion 23 or 123 are bonded to each other by a solid-phase bonding method, a liquid-phase bonding method, and the like, which use a binder. In such a way, the body portion 21 or 121 may be fabricated. In this case, the upper plate portion 23 in which the gas reservoir portion 24 is formed, and the tubular portion 122 in which the gas reservoir portion 124 is formed, can be fabricated. In the upper plate portion 23 and the tubular portion 122, the gas reservoir portions 24 and 124 may be formed by the process after the firing, or the gas reservoir portions 24 and 124 may be formed at the time of the molding.

As shown in FIG. 2, the heating member 10 includes a base 11, a resistance heating body 12, a tubular member 13, a power supply member 14, and an insulating pipe 15. The base 11 holds the substrate 2 as the processing target. For example, the base 11 can be formed into a disc or polygonal plate shape.

The base 11 includes a lower portion 11b which forms the gas providing passage 25 between the lower portion 11b itself and the tubular member 22 of the gas providing member 20, and an upper portion 11a which forms the gas providing passage 25 between the upper portion 11a itself and the upper plate portion 23 of the gas providing member 20. The upper portion 11a has the substrate mounting surface 10a. On outer circumference portions of the upper portion 11a and the lower portion 11b, the step difference portion 10b is formed. By the step difference portion 10b, a diameter (a crosswise length in FIG. 2) of the lower portion 11b is set larger than a diameter of the upper portion 11a.

A gas providing passage 11c is formed in the base 11. The gas providing passage 11c introduces the gas, which is provided from the tubular member 13, to the gas providing passage 25 formed between the base 11 and the gas providing member 20. The gas providing passage 11c is formed from a side surface of the base 11 toward a center of the base 11. A plurality of the gas providing passages 11c can be formed. For example, along a circumference direction of the base 11, two gas providing passages 11c may be formed at an interval of 180°, three gas providing passages 11c may be formed at an interval of 120°, or four gas providing passages 11c may be formed at an interval of 90°.

Moreover, on a lower surface (opposite surface to the substrate mounting surface 10a) of the base 11, a through hole 11d is formed. The through hole 11d allows the gas providing passage 11c and a gas introduction passage 13a formed inside of the tubular member 13 to communicate with each other. The gas provided from the gas introduction passage 13a is introduced to the gas providing passage 11c through the through hole 11d.

It is preferable that the base 11 be formed of the ceramics. For example, it is preferable that the base 11 contain the aluminum nitride, the silicon nitride, silicon carbide, the alumina, the sialon, and the like. According to this, corrosion resistance and heat resistance of the heating member 10 can be enhanced. It is preferable that the base 11 contain the aluminum nitride. According to this, uniform heating performance of the substrate mounting surface 10a can be enhanced.

The resistance heating body 12 is embedded in the base 11. The resistance heating body 12 generates heat upon receiving a supply of electric power from the power supply member 14, and raises temperature of the substrate heating surface 10a. For example, it is preferable that the resistance heating body 12 be formed of a high melting point material. For example, it is preferable that the resistance heating body 12 be formed of tungsten, molybdenum, a tungsten-molybdenum alloy, tungsten carbide, molybdenum carbide, or the like. A form of the resistance hating body 12 is not limited, and for example, one formed by printing a printing paste containing high melting point material powder, a linear, coil-like, belt-like bulk body or sheet (foil) of the high melting point material, a thin film of the high melting point material, which is formed by CVD or PVD, and the like, can be used. Moreover, a shape of the resistance heating body 12 is not limited either, and the resistance heating body 12 can be formed into a spiral shape, a mesh (wire netting) shape, a punched shape (punching metal), a shape having plural folded portions, and the like.

The tubular member 13 supports the base 11. Moreover, the tubular member 13 introduces the gas into the gas providing passage 11c of the base 11. Specifically, in the tubular member 13, the gas introduction passage 13a connected to the through hole 11d of the base 11 is formed. Moreover, the power supply member 14 and the insulating pipe 15 are arranged in an inner circumference side of the tubular member 13.

The tubular member 13 is connected to the lower surface of the base 11. For example, the tubular member 13 can be bonded to the substrate 11 by the solid-phase bonding method, the liquid-phase bonding method, and the like, which use the binder. In this case, the base 11 and the tubular member 13 can be integrated together, and air tightness of the gas introduction passage 13a of the tubular member 13 and the gas providing passage 11c of the base 11 can be ensured. Alternatively, the tubular member 13 can be bonded to the base 11 by a sealing member such as an O-ring and a metal packing. Also in such a way, the air tightness of the gas introduction passage 13a of the tubular member 13 and the gas providing passage 11c of the base 11 can be ensured.

It is preferable that the tubular member 13 be formed of the ceramics in a similar way to the base 11. In particular, it is preferable that the tubular member 13 be formed of ceramics of the same type as that of the base 11.

Since the power supply member 14 is electrically connected to the resistance heating body 12, the power supply member 14 supplies the electric power to the resistance heating body 12. It is preferable that the power supply member 14 be connected to the resistance heating body 12 by brazing, welding, eutectic bonding, crimping, fitting, screwing, and the like. For the power supply member 14, a power supply rod, a power supply line (a power supply wire), a complex of the power supply rod and the power supply line, and the like, can be used. Preferably, the power supply member 14 is formed of metal, more preferably, of nickel. The power supply member 14 is housed in the insulating pipe 15. The insulating pipe 15 is bonded to the lower surface of the base 11.

Figure 5:
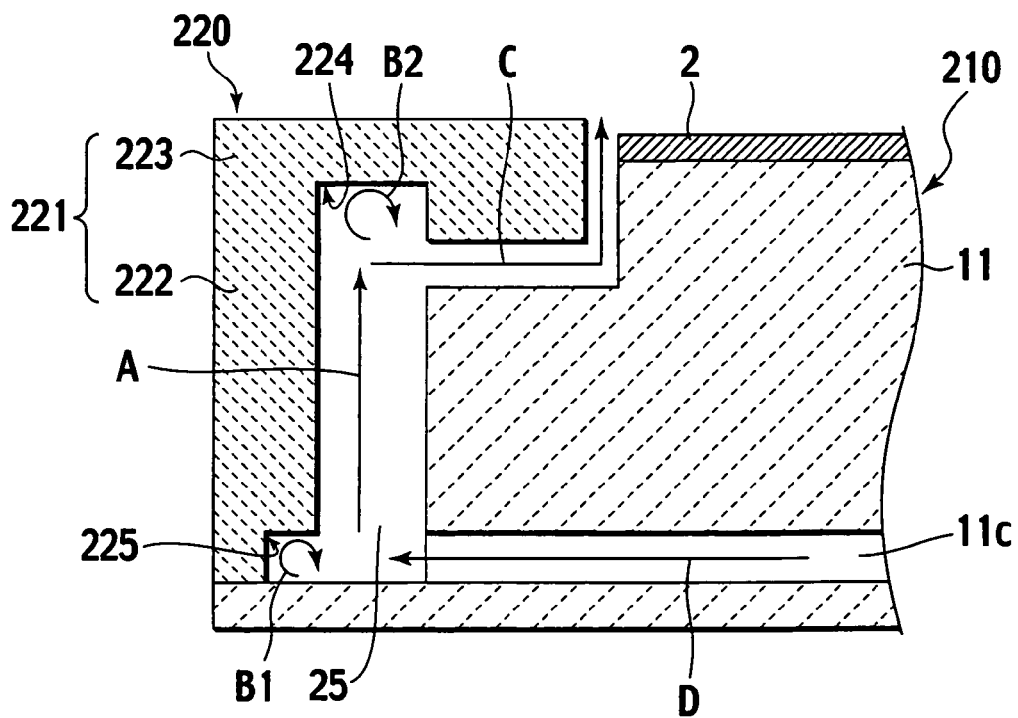

Note that the present invention is not limited to the above-described embodiment, and various alterations are possible. For example, as shown in FIG. 5, a plurality of gas reservoir portions 224 and 225 can be provided in a gas providing member 220. Specifically, the plurality of gas reservoir portions 224 and 225 can be formed in a body portion 221.

The gas reservoir portion 225 is formed into a rectangular shape in cross-section on a lower end of a tubular portion 222. The gas reservoir portion 225 is formed by notching an inner circumference surface of the lower end of the tubular portion 222 toward an outer circumference direction. As described above, the gas reservoir portion 225 is formed at a position where a gas flow D provided from the gas providing passage 11c of the base 11 is changed to the gas flow A going from the lower position of the gas providing passage 25 toward the upper portion thereof. In such a way, the disturbed gas flow B can be generated inside of the gas reservoir portion 225. As a result, the turbulence of the gas flow A which passes along the side of the gas reservoir portion 225 and goes toward the upper portion of the gas providing passage 25 can be reduced.

The gas reservoir portion 224 is formed into a rectangular shape in cross section on the lower surface of the upper plate portion 223. The gas reservoir portion 224 is formed at a position where the gas flow A in which the turbulence is reduced is changed to the gas flow C going from the crosswise outside of the gas providing passage 25 toward the crosswise inside thereof. In such a way, in the inside of the gas reservoir portion 224, a disturbed gas flow B2 can be generated. As a result, the turbulence of the gas flow C which passes below the gas reservoir portion 224 and is sent out onto the substrate 2 can be further reduced. As described above, by providing the plurality of gas reservoir portions 224 and 225, the turbulence of the gas flows A and C can be further reduced.

Moreover, in the heating member 10, an electrostatic electrode which generates electrostatic adsorption force, and a high frequency electrode which excites the reaction gas, can be provided. Specifically, the electrostatic electrode and the high frequency electrode can also be embedded in the base 11. Moreover, as processing materials, a plasma processing member which performs plasma processing for the substrate 2, a sputtering processing member which performs sputtering processing therefor, and the like, can be used besides the heating member 10.

EXAMPLES

A specific description will be made below of the present invention through an example.

First, the gas providing member 20 shown in FIG. 2 and FIG. 3 was fabricated. 95 wt % aluminum nitride powder and 5 wt % yttrium oxide powder (sintering aids) were mixed together, and the ceramic raw material powder was prepared. A binder (PVA), water, and a dispersant were added to the ceramic raw material powder concerned, and a resultant was mixed by using a ball mill, whereby slurry was made. Next, the slurry was sprayed and dried by using a spray dryer, and granulated powder was prepared. By using the granulated powder, the ceramic molded body serving as the body portion 21 was fabricated by the die molding method. By using the hot press method, the ceramic molded body was fired at 1860° C. in a nitrogen gas atmosphere.

Subsequently, in the upper plate portion 23 of the body portion 21, the gas reservoir portion 24 was formed by the process using a machining center (MC). Specifically, the groove, which was rectangular in cross section, was formed into the annular shape when viewed form the above, and had the width and the depth of 5 mm, was formed as the gas reservoir portion 24. In such a way, the gas providing member 20 was fabricated.

Moreover, the gas providing member 20 was disposed on the outer circumference side of the heating member 10, and the gas providing passage 25 was formed between the heating member 10 and the gas providing member 20.

Thereafter, the tubular member 13, the power supply member 14, and the insulating pipe 15, were bonded to the heating member 10 and the gas providing member 20, and the processing device 1 was fabricated.

By using the processing device 1, an introduction test of the gas was conducted. Nitrogen gas as the atmospheric gas was introduced at 20 sccm (standard cc/min) from the gas introduction passage 13a of the tubular member 13. As a result, the atmospheric gas was able to be provided stably and smoothly onto the substrate 2 mounted on the substrate mounting surface 10a through the gas providing passage 11c of the base 11 and the gas providing passage 25 formed between the heating member 10 and the gas providing member 20.

What is claimed is:

1. A gas providing member, comprising:
   a processing member which holds a processing target, the processing member including a heating member which performs heating processing for the processing target;
   a body portion comprising an upper plate portion that forms a gas providing passage between the upper plate portion and a step difference portion of the processing member;
   a first gas reservoir portion formed in the upper part of said body portion parallel to an upper surface of the processing member; and
   a second gas reservoir portion formed substantially at the other lower end of said body portion parallel to the upper surface of the processing member.

2. The gas providing member according to claim 1, wherein the body portion includes a tubular portion which forms the gas providing passage between the tubular portion and a side surface of the processing member.

3. The gas providing member according to claim 1, wherein the first gas reservoir portion is formed at a position in the gas providing passage where a flowing direction of the gas is changed and the second gas reservoir portion is formed at a position in the gas provided passage where the flowing direction of the gas is changed.

4. The gas providing member according to claim 1, wherein the gas reservoir portion is formed in a downstream portion of a gas flow in the gas providing passage.

5. The gas providing member according to claim 1, wherein the body portion is formed of ceramics.

6. The gas providing member according to claim 1, wherein a width of the gas providing passage is 2 mm to 20 mm in a crosswise direction.

7. The gas providing member according to claim 6, wherein the width of the gas providing passage is 2 mm to 10 mm in a crosswise direction.

8. The gas providing member according to claim 1, wherein the width of the first gas reservoir portion is 1 mm to 10 mm and a depth of the first gas reservoir portion is 1 mm to 10 mm and the width of the second gas reservoir portion is 1 mm to 10 mm and the depth of the second gas reservoir portion is 1 mm to 10 mm.

9. The gas providing member according to claim 1, wherein the gas providing passage extends in a direction that is substantially perpendicular to a surface of the processing member that holds the processing target.

10. The gas providing member according to claim 1, wherein said first and second gas reservoir portions are formed entirely within the body portion.

11. The gas providing member according to claim 1, wherein flow turbulence in the gas is generated in said first and second gas reservoir portions to reduce flow turbulence in the gas provided to the processing target.

12. A processing device, comprising:
   a processing member which holds a processing target, the processing member including a heating member which performs heating processing for the processing target; and
   a gas providing member disposed at a predetermined interval from the processing member on an outer circumference side of the processing member, wherein the gas providing member includes a body portion, comprising an upper plate portion that forms a gas providing passage between the upper plate portion and a step difference portion of the processing member;
   a first gas reservoir portion formed in the upper part of said body portion parallel to an upper surface of the processing member; and
   a second gas reservoir portion formed substantially at the lower end of said body portion parallel to the upper surface of the processing member.

* * * * *